(12) United States Patent
Amari

(10) Patent No.: US 9,318,611 B2
(45) Date of Patent: Apr. 19, 2016

(54) THIN FILM TRANSISTOR, METHOD OF MANUFACTURING THE SAME, AND ELECTRONIC APPARATUS

(71) Applicant: Sony Corporation, Tokyo (JP)

(72) Inventor: Koichi Amari, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 14/321,225

(22) Filed: Jul. 1, 2014

(65) Prior Publication Data

US 2015/0021572 A1  Jan. 22, 2015

(51) Int. Cl.
| | |
|---|---|
| H01L 21/4763 | (2006.01) |
| H01L 29/786 | (2006.01) |
| H01L 29/06 | (2006.01) |
| H01L 29/16 | (2006.01) |
| H01L 29/66 | (2006.01) |
| H01L 51/00 | (2006.01) |
| H01L 51/05 | (2006.01) |
| H01L 29/417 | (2006.01) |

(52) U.S. Cl.
CPC .......... *H01L 29/786* (2013.01); *H01L 29/1604* (2013.01); *H01L 29/41733* (2013.01); *H01L 29/6675* (2013.01); *H01L 29/66757* (2013.01); *H01L 29/78618* (2013.01); *H01L 51/0001* (2013.01); *H01L 51/0021* (2013.01); *H01L 51/0508* (2013.01); *H01L 51/0545* (2013.01)

(58) Field of Classification Search
CPC ............ H01L 29/786; H01L 29/78618; H01L 29/41733; H01L 29/66757; H01L 29/6675; H01L 29/1604; H01L 51/0001; H01L 51/0508
USPC .............. 257/27, 40, 255, 347, 368, E21.411, 257/E21.438, E21.585, E21.641, E23.011, 257/E29.116, E29.242; 438/430, 597, 620, 438/682
See application file for complete search history.

(56) References Cited

U.S. PATENT DOCUMENTS

| | | | | |
|---|---|---|---|---|
| 7,709,369 | B2 * | 5/2010 | Lee et al. | 438/620 |
| 8,299,455 | B2 * | 10/2012 | Doris et al. | 257/27 |
| 8,502,319 | B2 * | 8/2013 | Takeda | 257/368 |
| 2010/0148155 | A1 * | 6/2010 | Choi et al. | 257/40 |
| 2012/0104466 | A1 * | 5/2012 | Zhu et al. | 257/255 |
| 2012/0112279 | A1 * | 5/2012 | Cheng et al. | 257/347 |
| 2013/0154026 | A1 * | 6/2013 | Alptekin et al. | 257/384 |

FOREIGN PATENT DOCUMENTS

| | | |
|---|---|---|
| JP | 2001-305576 | 10/2001 |
| JP | 2012-160679 | 8/2012 |

\* cited by examiner

*Primary Examiner* — Dao H Nguyen
(74) *Attorney, Agent, or Firm* — Hazuki International, LLC

(57) ABSTRACT

A thin film transistor includes: a gate electrode and a pair of source and drain electrodes; and a semiconductor layer having a channel formed therein, and having a pair of connection sections connected to the pair of source and drain electrodes, respectively, wherein one or both of opposed surfaces of the pair of connection sections is a non-flat surface.

11 Claims, 16 Drawing Sheets

THIN FILM TRANSISTOR, METHOD OF MANUFACTURING THE SAME, AND ELECTRONIC APPARATUS

CROSS REFERENCES TO RELATED APPLICATIONS

The present application claims priority to Japanese Priority Patent Application JP 2013-150413 filed in the Japan Patent Office on Jul. 19, 2013, the entire content of which is hereby incorporated by reference.

BACKGROUND

The present application relates to a thin film transistor (TFT) in which a connection section between a channel and an electrode line is formed by dry etching, a method of manufacturing the thin film transistor, and an electronic apparatus including the thin film transistor.

In flat panel displays such as liquid crystal displays and organic electro luminescence (EL) displays, a thin film transistor (TFT) is widely used as a drive element in practical applications. The thin film transistor is fabricated using a semiconductor material such as amorphous silicon (Si), polycrystalline silicon (polysilicon), oxide semiconductor, or organic semiconductor for an active layer (a channel).

The channel formed using such a semiconductor material is electrically connected to an electrode line (for example, each of source and drain electrodes) via a contact hole provided in an interlayer insulating film. The contact hole is formed by, for example, wet etching (for example, Japanese Unexamined Patent Application Publication Nos. 2001-305576 and 2012-160679). In the case where the contact hole is formed by wet etching, however, layout efficiency has been low since it is necessary to consider a process margin for protection of a channel region from seepage of an etchant.

Such low layout efficiency is allowed to be reformed by forming the contact hole by dry etching.

SUMMARY

However, when the contact hole is formed by dry etching, the contact hole penetrates a channel. This is because a metal silicide film or the like to be an etching stopper film is not provided in a layer under the channel unlike a complementary metal oxide semiconductor (CMOS) process, and contact area between the channel and an electrode line is limited to area of a side face of the contact hole provided in the channel. As a result, contact resistance increases while layout efficiency is improved. In addition, since current concentration easily occurs, electromigration (EM) resistance is degraded.

It is desirable to provide a thin film transistor that is reduced in contact resistance and improved in EM resistance, a method of manufacturing the thin film transistor, and an electronic apparatus.

According to an embodiment of the present application, there is provided a thin film transistor, including: a gate electrode and a pair of source and drain electrodes; and a semiconductor layer having a channel formed therein, and having a pair of connection sections connected to the pair of source and drain electrodes, respectively, wherein one or both of opposed surfaces of the pair of connection sections is a non-flat surface.

According to an embodiment of the present application, there is provided a method of manufacturing a thin film transistor, the method including the following steps:

(A) forming a gate electrode on a substrate;
(B) forming a semiconductor layer on the substrate and the gate electrode;
(C) forming a through-hole in the semiconductor layer, and forming a pair of connection sections having opposed surfaces one or both of which is a non-flat surface; and
(D) forming a pair of source and drain electrodes on the semiconductor layer, the source and drain electrodes being to be connected to the semiconductor layer via the connection sections.

According to an embodiment of the present application, there is provided an electronic apparatus provided with a display unit, the display unit being provided with a plurality of display devices and a plurality of thin film transistors configured to drive the display devices, each of the thin film transistors including: a gate electrode and a pair of source and drain electrodes; and a semiconductor layer having a channel formed therein, and having a pair of connection sections connected to the pair of source and drain electrodes, respectively, wherein one or both of opposed surfaces of the pair of connection sections is a non-flat surface.

In the thin film transistor, the method of manufacturing the thin film transistor, and the electronic apparatus according to the above-described respective embodiments of the present application, one or both of the opposed surfaces of the pair of connection sections provided in the semiconductor layer is formed to be a non-flat surface. This expands contact area between the semiconductor layer and the source and/or drain electrode in one or both of the connection sections.

According to the thin film transistor, the method of manufacturing the thin film transistor, and the electronic apparatus of the above-described respective embodiments of the present application, one or both of the opposed surfaces of the pair of connection sections provided in the semiconductor layer is formed to be a non-flat surface. This expands contact area between the semiconductor layer and the source and/or drain electrode in one or both of the connection sections, and contact resistance is allowed to be reduced. Furthermore, since occurrence of current concentration is allowed to be suppressed, EM resistance is improved.

It is to be understood that both the foregoing general description and the following detailed description are exemplary, and are intended to provide further explanation of the technology as claimed.

Additional features and advantages are described herein, and will be apparent from the following Detailed Description and the figures.

BRIEF DESCRIPTION OF THE FIGURES

The accompanying drawings are included to provide a further understanding of the disclosure, and are incorporated in and constitute a part of this specification. The drawings illustrate embodiments and, together with the specification, serve to explain the principles of the technology.

DETAILED DESCRIPTION

Hereinafter, some embodiments of the present disclosure will be described in detail with reference to the accompanying drawings. It is to be noted that description is made in the following order.

1. First embodiment (a bottom-gate-type TFT having comblike connection sections).
 1-1. Configuration of TFT.
 1-2. Method of manufacturing TFT.
 1-3. Overall configuration of display unit.
 1-4. Functions and effects.
2. Second embodiment (TFT having rounding connection sections).
3. Modifications.
 3-1. Modification 1 (TFT having a plurality of connection sections).
 3-2. Modification 2 (an example where a connection section is provided on an end face of a semiconductor).
 3-3. Modification 3 (an example where a wall surface of a connection section has a cone angle).
 3-4. Modification 4 (top-gate-type TFT).
4. Application examples.

<1. First Embodiment>

[1-1. Configuration of Thin Film Transistor]

Figure 1A:
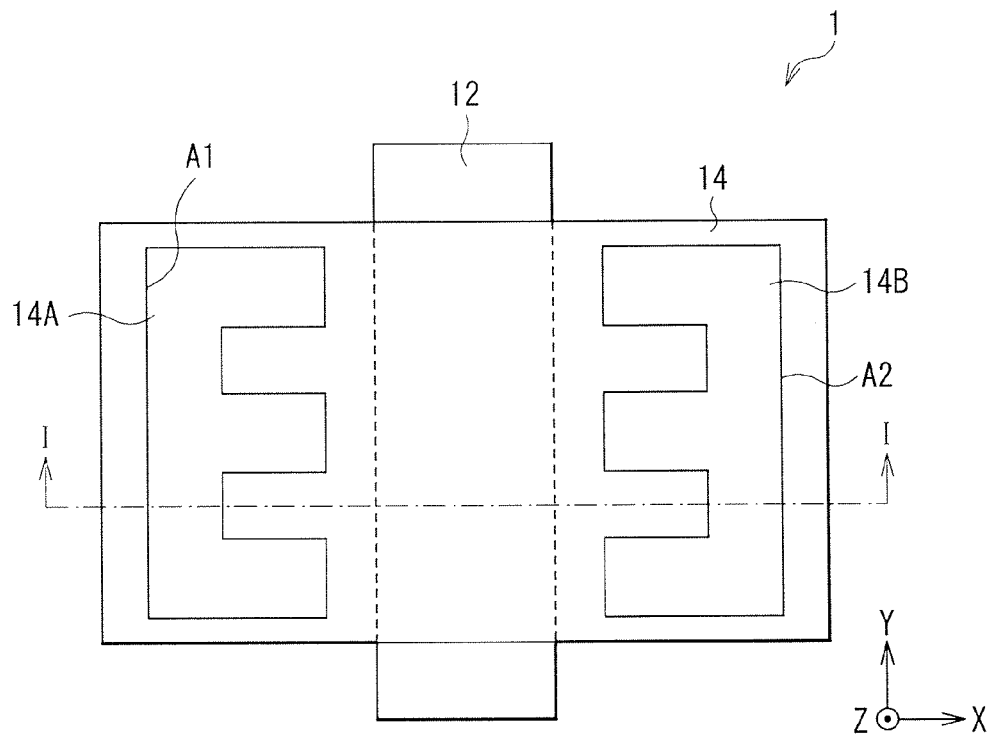
FIG. 1A is a plan diagram illustrating a configuration of a thin film transistor according to a first embodiment of the present disclosure.
Figure 1B:
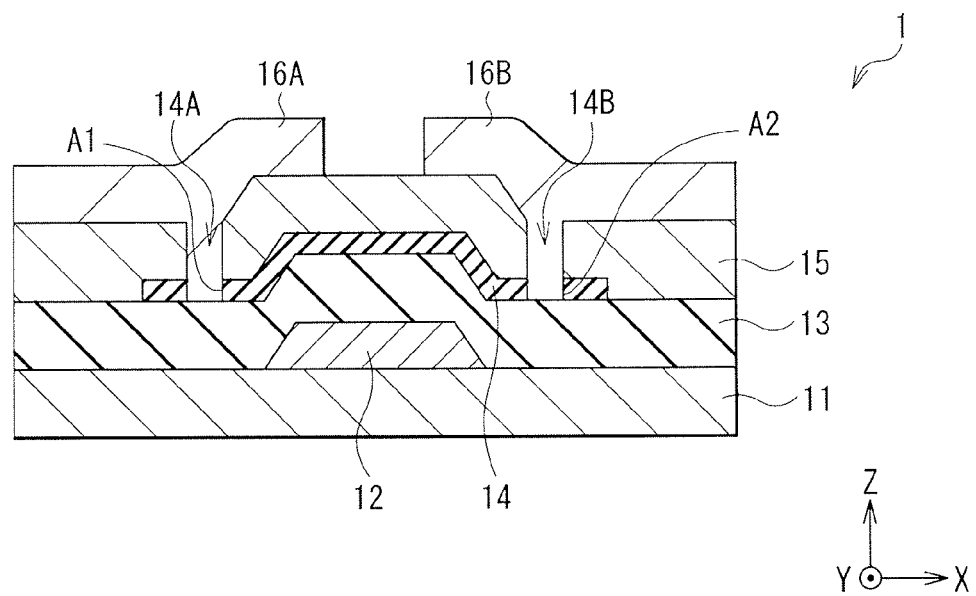
FIG. 1B is a cross-sectional diagram of the thin film transistor illustrated in FIG. 1A.

FIG. 1A illustrates a planar configuration of a thin film transistor (TFT) 1 according to a first embodiment of the present disclosure. FIG. 1B illustrates a cross-sectional configuration of the thin film transistor 1 along a I-I line in FIG. 1A. The thin film transistor 1 is TFT of a so-called bottom gate type (an inversely staggered structure). In the thin film transistor 1, a gate electrode 12, a gate insulating film 13, a semiconductor layer 14, a channel protective film 15, and source and drain electrodes 16A and 16B are provided in this order on a substrate 11 configured of glass or the like. In the thin film transistor 1 of the first embodiment, the semiconductor layer 14, the source electrode 16A, and the drain electrode 16B are electrically connected to one another via wall surfaces (connection sections A1 and A2) of throughholes 14A and 14B provided in the semiconductor layer 14.

The gate electrode 12 has a role of applying a gate voltage to the thin film transistor 1 to control electron density in the semiconductor film 14 by the gate voltage. The gate electrode 12 is provided in a selective region on the substrate 11, and, for example, may be configured of a single-element metal such as platinum (Pt), titanium (Ti), ruthenium (Ru), molybdenum (Mo), copper (Cu), tungsten (W), nickel (Ni), aluminum (Al), and tantalum (Ta), or alloy thereof. For example, the gate electrode 12 may be configured of a light-transmissive oxide primarily constituting indium (In) or zinc (Zn), and may be specifically configured of a transparent conductive thin film including indium tin oxide (ITO), indium zinc oxide (IZO), zinc oxide (ZnO), or the like. A stack of two or more of such materials may be used for the gate electrode 12. For example, an aluminum layer or an aluminum alloy layer having a thickness (thickness in a stacked direction (Z direction), hereinafter simply called thickness) of 400 nm and a molybdenum layer having a thickness of 50 nm may be stacked. Examples of the aluminum alloy layer may include an aluminum-neodymium alloy layer.

For example, the insulating film 13 may be configured by an insulating film including one or more of a silicon oxide (SiO) film, a silicon nitride (SiN) film, a silicon oxynitride (SiON) film, a hafnium oxide (HfO) film, an aluminum oxide (AlO) film, an aluminum nitride (AlN) film, a tantalum oxide (TaO) film, a zirconium oxide (ZrO) film, a hafnium oxynitride film, a hafnium-silicon oxynitride film, an aluminum oxynitride film, a tantalum oxynitride film, and a zirconium oxynitride film. The insulating film 13 may have a single-layer structure, or may have a stacked structure of two or more layers such as, for example, a SiN layer and a SiO layer. When the insulating film 13 has a stacked structure of two or more layers, it is possible to improve interfacial characteristics of the semiconductor layer 14, or to effectively suppress impurity contamination from the outside air into the semiconductor layer 14. For example, the insulating film 13 may have a thickness of 200 nm to 800 nm both inclusive.

The semiconductor layer 14 is provided in an island pattern on the insulating film 13, and has a channel region at a position opposed to the gate electrode 12 between a pair of source and drain electrodes 16A and 16B. For example, the semiconductor layer 14 may be configured of poly-Silicon (low-temperature poly-silicon; LTPS or high-temperature poly-silicon; HTPS) formed at low or high temperature, or amorphous silicon. For example, the semiconductor layer 14 may be configured of an oxide semiconductor primarily constituting oxide of one or more of elements of indium (In), gallium (Ga), zinc (Zn), silicon (Si), tin (Sn), aluminum (Al), and titanium (Ti). The semiconductor layer 14 may be configured of a composite oxide of such elements. Examples of such an oxide semiconductor may include amorphous oxide semiconductor such as indium tin zinc oxide (ITZO) and indium gallium zinc oxide (IGZO, InGaZnO). The semiconductor layer 14 may be partially configured of such amorphous oxide semiconductor. The semiconductor layer 14 may also be configured of crystalline oxide semiconductor such as, for example, zinc oxide (ZnO), indium zinc oxide (IZO), indium gallium oxide (IGO), ITO, and indium oxide (InO). Transparent oxide semiconductor primarily constituting zinc oxide, such as, for example, indium gallium zinc oxide (IGZO), zinc oxide, aluminum-doped zinc oxide (AZO), or gallium-doped zinc oxide may be used for the semiconductor layer 14. Although the semiconductor layer 14 may be amorphous or crystalline, a crystalline semiconductor layer 14 has a relatively high resistance to an etching solution, and is therefore more easily applied to formation of a device structure. Furthermore, the semiconductor layer 14 may be configured of an organic semiconductor material that may contain, for example, an organic conductive material and a doping material. For example, one or more of polythiophene, polypyrrole, polyaniline, polyacetylene, polyphenylene, polyfuran, polyselenophene, polyisothianaphthene, polyphenylene sulfide, polyphenylene vinylene, polythienylene vinylene, polynaphthalene, polyanthracene, polypyrene, polyazulene, phthalocyanine, pentacene, merocyanine, and polyethylenedioxythiophene may be used as the organic conductive material. For example, one or more of iodine, perchloric acid, hydrochloric acid, sulfuric acid, nitric acid, phosphoric acid, tetrafluoroboric acid, arsenic pentafluoride, hexafluorophosphoric acid, alkyl sulfonic acid, perfluoroalkyl sulfonic acid, polyacrylic acid, polystyrene sulfonic acid, and dodecylbenzenesulfonic acid may be used as the doping material. For example, thickness of the semiconductor layer 14 may be preferably 5 nm to 100 nm both inclusive in consideration of efficiency of oxygen supply during anneal in a manufacturing process.

For example, the channel protective film 15 may be provided on the semiconductor layer 14 and the insulating film 13 so as to cover the semiconductor layer 14. The channel protective film 15 prevents damage of the semiconductor layer 14 (channel region) during formation of the source electrode 16A and the drain electrode 16B. Examples of a material for the channel protective film 15 may include silicon oxide, aluminum oxide, and silicon nitride. Thickness of the channel protective film 15 is, for example, about 10 nm to 300 nm both inclusive.

The source electrode 16A and the drain electrode 16B pair with each other across the channel protective film 15 in a channel length direction (an X axis direction) of the semiconductor layer 14, and are connected to the semiconductor layer 14 via through-holes 14A and 14B continuously penetrating the channel protective film 15 and the semiconductor layer 14. The same material as the material for the gate electrode 12 may be used for the source electrode 16A and the drain electrode 16B. For example, the source electrode 16A and the drain electrode 16B are each configured of a single-layer film including one of molybdenum, aluminum, copper (Cu), titanium, ITO, and titanium oxide, or a stacked film including two or more of them. Examples of a configuration of the stacked film may include a stack of a molybdenum layer, an aluminum layer, and a molybdenum layer, and a stack of a molybdenum layer, an aluminum layer, and a titanium layer. The constitutional material of each of the source electrode 16A and the drain electrode 16B may be appropriately selected depending on purposes or applications of the thin film transistor 1.

In the first embodiment, as described above, the semiconductor layer 14 is electrically connected to the source electrode 16A and the drain electrode 16B via the wall surfaces (connection sections A1 and A2) of the through-holes 14A and 14B provided in the semiconductor layer 14. The through-holes 14A and 14B, i.e., the connection sections A1 and A2, are shaped to have non-flat surfaces on their respective opposed surfaces across the gate electrode 12. Specifically, as illustrated in FIG. 1A, the connection sections A1 and A2 have a plurality of concavo-convex surfaces on their respective opposed surfaces, and thus each have a comblike cross-sectional shape in an XY direction. Consequently, contact area between the semiconductor layer 14 and each of the source electrode 16A and the drain electrode 16B increases, resulting in reduction in contact resistance.

A protective film, a planarization film, and the like, any of which is undepicted, are provided on the source electrode 16A and the drain electrode 16B. For example, the protective film may be configured of a single-layer film of one of an aluminum oxide film and a silicon oxide film, or a stacked film of the aluminum oxide film and the silicon oxide film. For example, the protective film may have a thickness of 10 nm to 100 nm both inclusive, preferably 50 nm or less. The planarization film planarizes a surface of the substrate 11, the surface having been made uneven by providing the thin film transistor 1, and, for example, may be configured of an organic material such as acryl, polyimide, and novolac.

[1-2. Method of Manufacturing Thin Film Transistor 1]

FIGS. 2A to 2D are diagrams for explaining a method of manufacturing the thin film transistor 1. For example, the thin film transistor 1 may be manufactured as follows.

Figure 2A:
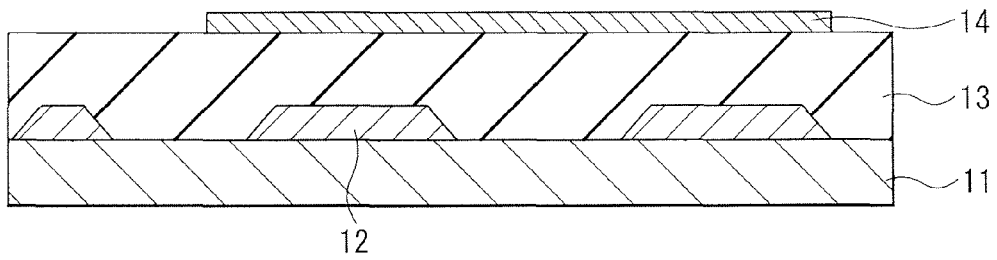
FIG. 2A is a cross-sectional diagram illustrating a manufacturing process of the thin film transistor illustrated in FIGS. 1A and 1B.

First, as illustrated in FIG. 2A, a metal film (for example, a Mo film) is formed on the entire surface of the substrate 11 by a sputtering process or an evaporation process in a thickness of 50 nm, for example. Subsequently, the metal film is patterned by, for example, a photolithography process and an etching process to form the gate electrode 12. Subsequently, the insulating film 13 (for example, an $SiO_2$ film) is formed by, for example, a plasma CVD process so as to cover the substrate 11 and the gate electrode 12, and then the semiconductor layer 14 is formed on the insulating film 13 by, for example, a sputter process.

Figure 2B:
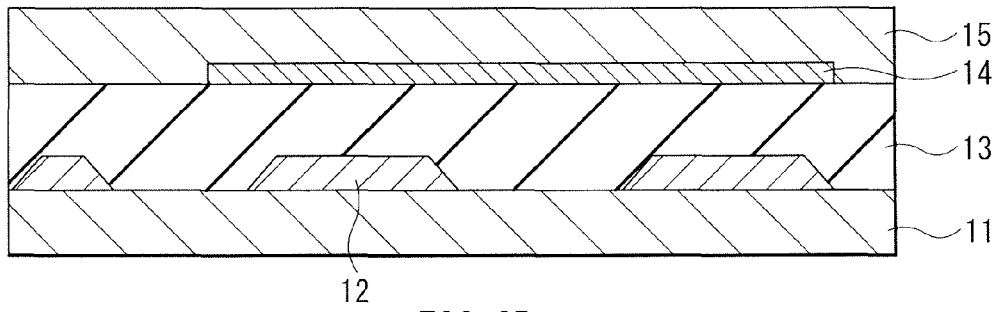
FIG. 2B is a cross-sectional diagram following FIG. 2A.
Figure 2C:
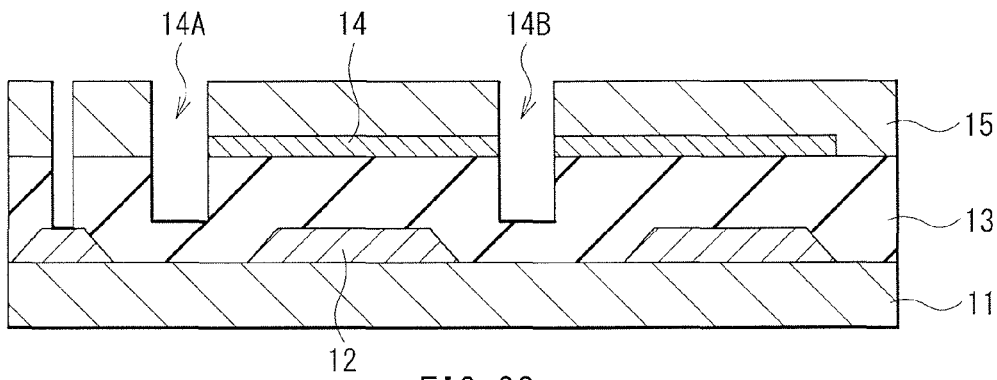
FIG. 2C is a cross-sectional diagram following FIG. 2B.

Subsequently, as illustrated in FIG. 2B, the channel protective film 15 (for example, a $SiO_2$ film) is formed on the insulating film 13 and the semiconductor layer 14 in a thickness of 300 nm, for example. Subsequently, as illustrated in FIG. 2C, the through-holes 14A and 14B are formed by, for example, a photolithography process and an etching process in a manner of penetrating the channel protective film 15 and the semiconductor layer 14. Although both of a wet etching process and a dry etching process may be used, selecting the dry etching process improves layout efficiency of the thin film transistor 1. The dry etching process makes it possible to perform anisotropic etching by using $CF_4$, $C_4F_8$, and $SF_6$ while oxygen ($O_2$) and argon (Ar) are mixed to such gases. The through-holes 14A and 14B may each completely penetrate the gate insulating film 13 so that a bottom thereof becomes on a level with the surface of the substrate 11.

Figure 2D:
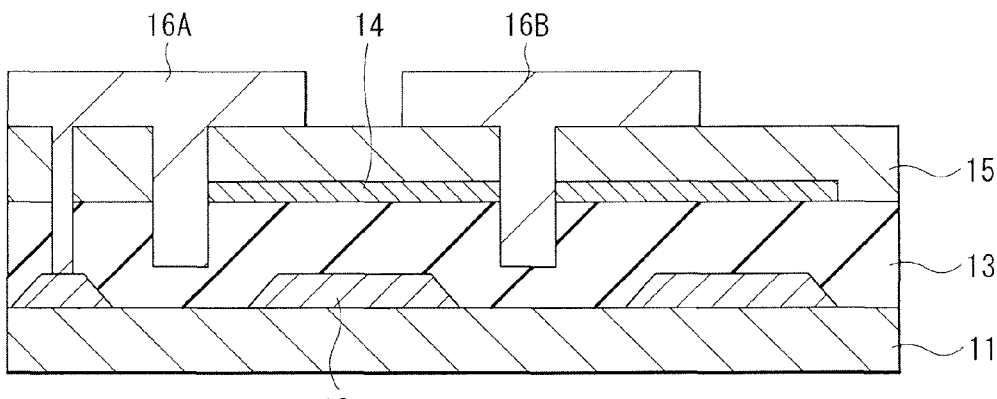
FIG. 2D is a cross-sectional diagram following FIG. 2C.

Subsequently, as illustrated in FIG. 2D, a metal film (a Mo/Al/Mo stacked film) is formed on the channel protective film 15 by, for example, a sputtering process in a thickness of 50 nm/500 nm/50 nm, for example. Subsequently, the metal film is patterned by, for example, a photolithography process and an etching process to form the source electrode 16A and the drain electrode 16B.

Finally, an insulating film (for example, an aluminum oxide film as a protective film) is formed on the channel protective film 15, the source electrode 16A, and the drain electrode 16B by, for example, a sputtering process or an atomic layer deposition (ALD) process, and then an organic insulating film (for example, a polyimide film as a planarization film) is formed by, for example, a spin coating process. Consequently, the thin film transistor 1 illustrated in FIGS. 1A and 1B is completed.

[1-3. Overall Configuration of Display Unit]

Figure 3:
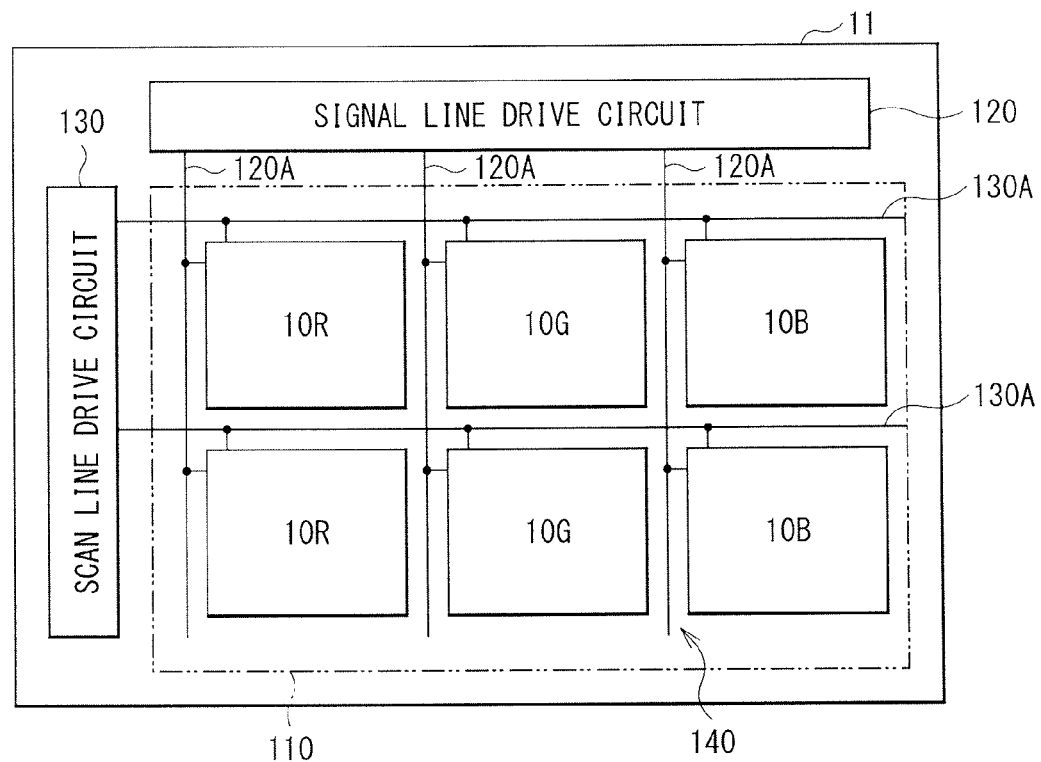
FIG. 3 is a block diagram illustrating an exemplary configuration of a display unit including the thin film transistor according to an embodiment of the present disclosure.
Figure 4:
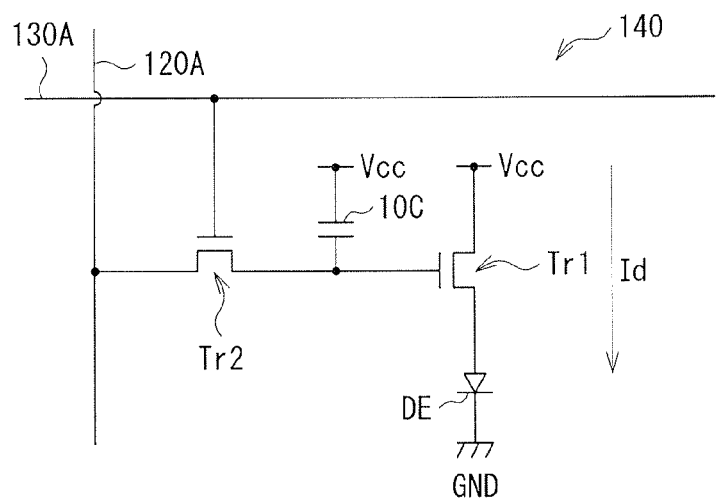
FIG. 4 is a circuit diagram illustrating a detailed exemplary configuration of pixel illustrated in FIG. 3.

An exemplary display unit including the thin film transistor 1 is now described with FIGS. 3 and 4. FIG. 3 illustrates an overall configuration of the display unit. In the display unit, a plurality of pixels 10R, 10G, and 10B are disposed in a matrix in a display region 110 on the substrate 11. The pixels 10R, 10G, and 10B have display devices such as, for example, organic electroluminescence (EL) devices emitting light of red, green, and blue, respectively. To drive the pixels 10R, 10G, and 10B, a signal line drive circuit 120 and a scan line drive circuit 130 for image display are provided in the periphery of the display region 110, and a pixel drive circuit 140 is provided in the inside of the display region 110.

FIG. 4 illustrates an example of the pixel drive circuit 140. The pixel drive circuit 140 is an active drive circuit that includes a drive transistor Tr1, a write transistor Tr2, and a holding capacitance element provided between the transistors Tr1 and Tr2. For example, the transistor 1 may serve as the write transistor Tr2. The display device provided in each of the pixels 10R, 10G, and 10B is connected in series to the drive transistor Tr1 between a first power line (Vcc) and a second power line (GND).

In the pixel drive circuit 140, a plurality of signal lines 120A are disposed in a column direction, and a plurality of scan lines 130A are disposed in a row direction. An intersection of each signal line 120A and each scan line 130A corresponds to one of the pixels 10R, 10G, and 10B. Each signal line 120A is connected to the signal line drive circuit 120 that supplies an image signal to a source electrode of the write transistor Tr2 via the signal line 120A. For example, the wiring 12W may serve as the signal line 120A. Each scan line 130A is connected to the scan line drive circuit 130 that sequentially supplies scan signals to the gate electrodes of the write transistors Tr2 via the scan lines 130A.

[1-4. Functions and Effects]

As described above, contact between the channel and the electrode line (each of the source electrode and the drain electrode) is made via the contact hole formed by the wet etching process in the interlayer insulating film provided therebetween. In the wet etching process, however, layout efficiency has been low since spacing between the contact hole on a source electrode side and the contact hole on a drain electrode side is necessary to be designed wide in order to protect the channel region from seepage of an etchant.

On the other hand, the dry etching process allows processing at a high aspect ratio and allows the contact holes to be formed with a reduced spacing between the contact hole on the source electrode side and the contact hole on the drain electrode side, leading to improvement in layout efficiency. However, the contact hole formed by the dry etching process penetrates through the channel due to low etching selectivity of the interlayer insulating film to the channel. As a result, the connection section between the channel and each of the source electrode and the drain electrode is limited to a side face of the contact hole formed in the channel, i.e., limited to an area corresponding to thickness of the channel. Consequently, contact area between the channel and each of the source electrode and the drain electrode is decreased compared with a case of using the wet etching process, which disadvantageously leads to increase in contact resistance. Moreover, since current concentration easily occurs, EM resistance is degraded.

In contrast, in the thin film transistor 1 and the method of manufacturing the thin film transistor 1 of the first embodiment, the opposed surfaces of the connection sections A1 and A2, the connection sections A1 and A2 being disposed with the gate electrode 12 in between and respectively connecting the semiconductor layer 14 and the source electrode 16A and the semiconductor layer 14 and the drain electrode 16B, are each formed to be a non-flat surface. Specifically, a sectional shape in the XY direction of each of the opposed surfaces of the connection sections A1 and A2 is formed into a comb shape, which makes it possible to increase contact area between the semiconductor layer 14 and the source electrode 16A in the connection section A1 and contact area between the semiconductor layer 14 and the drain electrode 16B in the connection section A2.

As described above, according to the thin film transistor 1 and the method of manufacturing the thin film transistor 1 of the first embodiment, the opposed surfaces of the opposed connection sections A1 and A2 between the semiconductor layer 14 and the source electrode 16A as well as the drain electrode 16B are each formed into the comb shape. This results in increase in contact area between the semiconductor layer 14 and the source electrode 16A in the connection section A1 and contact area between the semiconductor layer 14 and the drain electrode 16B in the connection section A2. Consequently, contact resistance of each of the connection sections A1 and A2 is reduced, and occurrence of current concentration is allowed to be suppressed, leading to improvement in EM resistance.

Moreover, the through-holes 14A and 14B to be the connection sections A1 and A2 between the semiconductor layer 14 and the source electrode 16A as well as the drain electrode 16B are formed by the dry etching process, which makes it possible to improve layout efficiency of the thin film transistor 1. Consequently, size reduction of the thin film transistor 1 is achieved.

A second embodiment and Modifications 1 to 4 are now described. Components similar to those in the first embodiment are designated by the same numerals, and description thereof is appropriately omitted.

<2. Second Embodiment>

Figure 5A:
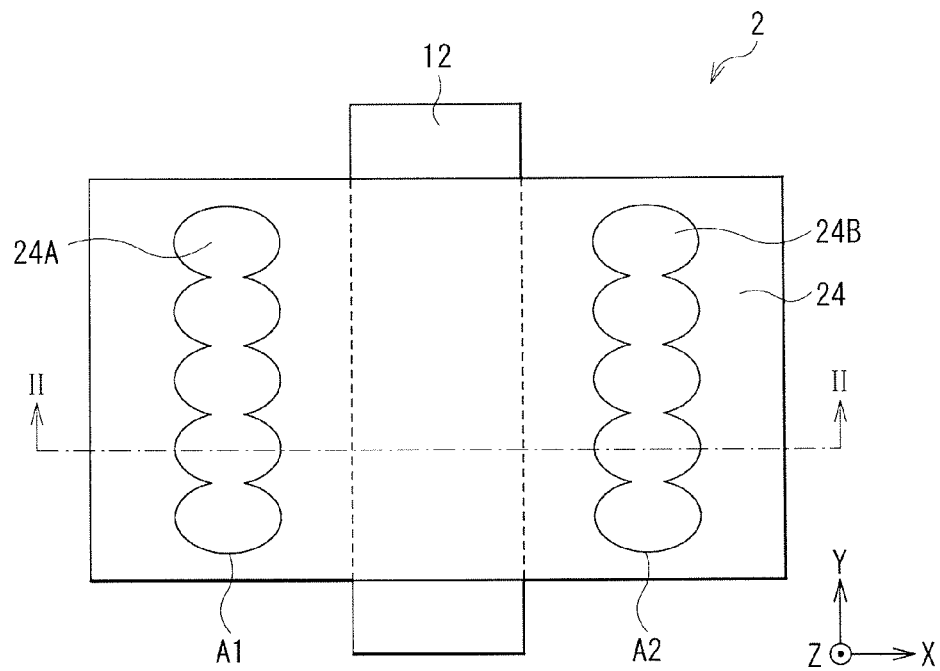
FIG. 5A is a plan diagram illustrating a configuration of a thin film transistor according to a second embodiment of the present disclosure.
Figure 5B:
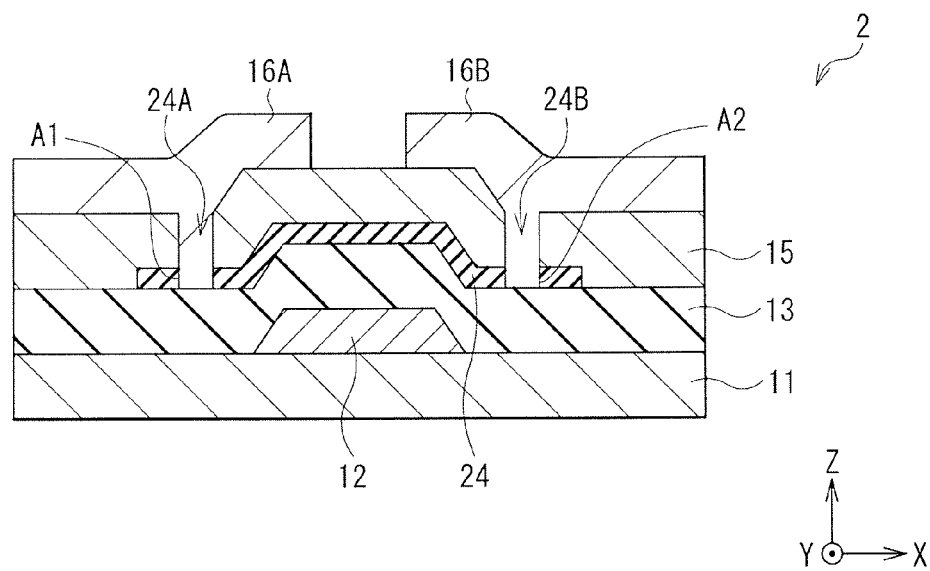
FIG. 5B is a cross-sectional diagram of the thin film transistor illustrated in FIG. 5A.

FIG. 5A illustrates a planar configuration of a thin film transistor (TFT) 2 according to a second embodiment of the present disclosure. FIG. 5B illustrates a cross-sectional configuration of the thin film transistor 2 along a II-II line in FIG. 5A. The thin film transistor 2 is different from the thin film transistor 1 of the first embodiment in that a sectional shape in the XY direction of each of the connection sections A1 and A2 provided in a semiconductor layer 24 is formed into a shape of a contour of a plurality of circles (a rounding shape).

The rounding connection sections A1 and A2 as in the second embodiment are allowed to be formed by controlling an exposure condition in a photolithography process when through-holes 24A and 24B are formed while continuously penetrating the channel protective film 15 and the semiconductor layer 14.

As described above, in the second embodiment, the sectional shape in the XY direction of each of the connection sections A1 and A2 provided in the semiconductor layer 24 is formed into the rounding shape, which makes it possible to reduce contact resistance of each of the connection sections A1 and A2 and to suppress occurrence of current concentration as with the first embodiment, leading to improvement in EM resistance.

<3. Modifications>

Thin film transistors (thin film transistors 3, 1A, 2A, 3A, 3B, 3C, and 4 to 7) according to Modifications (Modifications 1 to 4) of the thin film transistors 1 and 2 according to the first and second embodiments are now described.

[3-1. Modification 1]

Figure 6A:
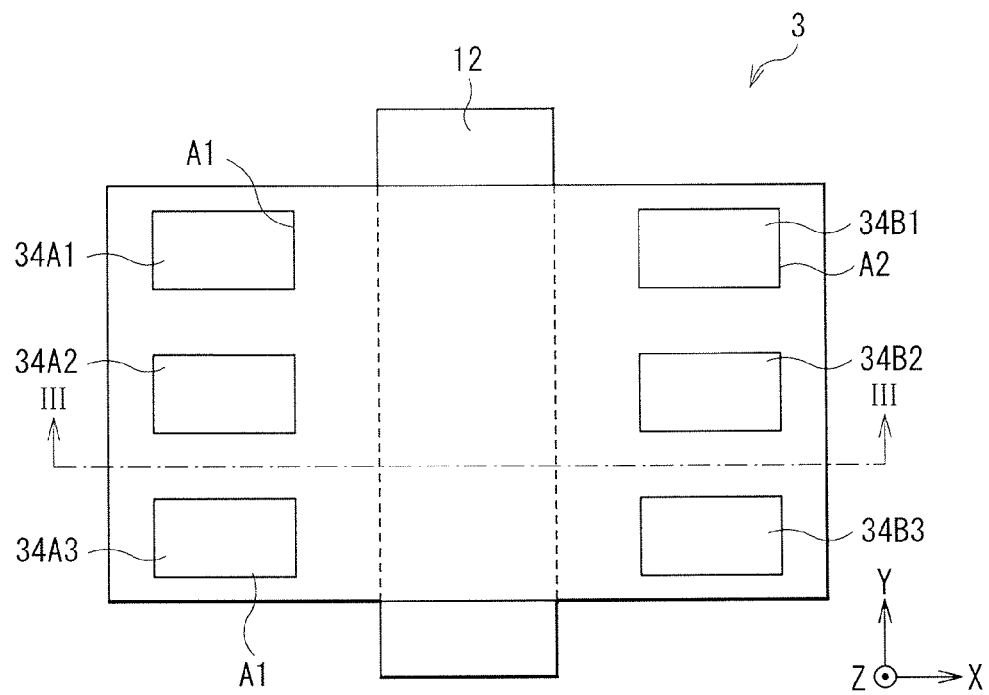
FIG. 6A is a plan diagram illustrating a configuration of a thin film transistor according to Modification 1 of the present disclosure.
Figure 6B:
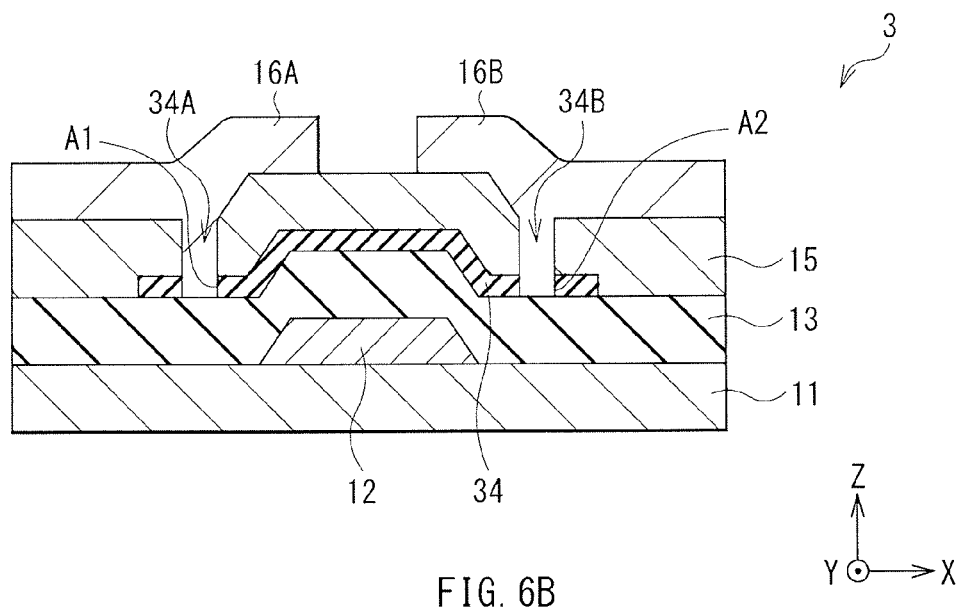
FIG. 6B is a cross-sectional diagram of the thin film transistor illustrated in FIG. 6A.

FIG. 6A illustrates a planar configuration of a thin film transistor 3 according to Modification 1 of an embodiment of the present disclosure. FIG. 6B illustrates a cross-sectional configuration of the thin film transistor 3 along a III-III line in FIG. 6A. The thin film transistor 3 is a bottom-gate-type TFT as with the thin film transistor 1 of the first embodiment. The Modification 1 is different from the first embodiment in that connection sections A1 and A2 provided in a semiconductor layer 34 are formed by, for example, a plurality of rectangular through-holes 34A ($34A_1 \ldots 34A_n$) and 34B ($34B_1 \ldots 34B_m$). Although three through-holes 34A and three through-holes 34B are provided in this exemplary case, this is not limitative. Two or four or more through-holes 34A and two or four or more through-holes 34B may be provided.

In this way, the connection sections A1 and A2 between the semiconductor layer 34 and the source electrode 16A as well as the drain electrode 16B are provided as the plurality of through-holes $34A_1$, $34A_2$, and $34A_3$ and the plurality of through-holes $34B_1$, $34B_2$, and $34B_3$, respectively, which also provides effects similar to those in the first and second embodiments.

[3-2. Modification 2]

Figure 7A:
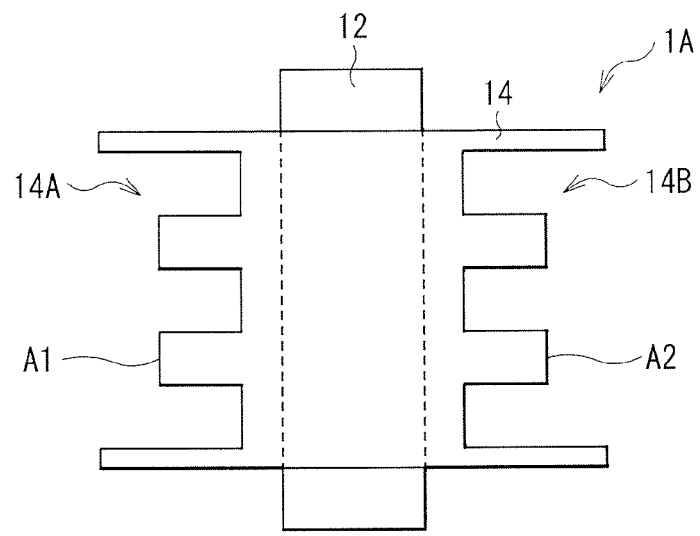
FIG. 7A is a plan diagram illustrating an exemplary configuration of a thin film transistor according to Modification 2 of the present disclosure.
Figure 7B:
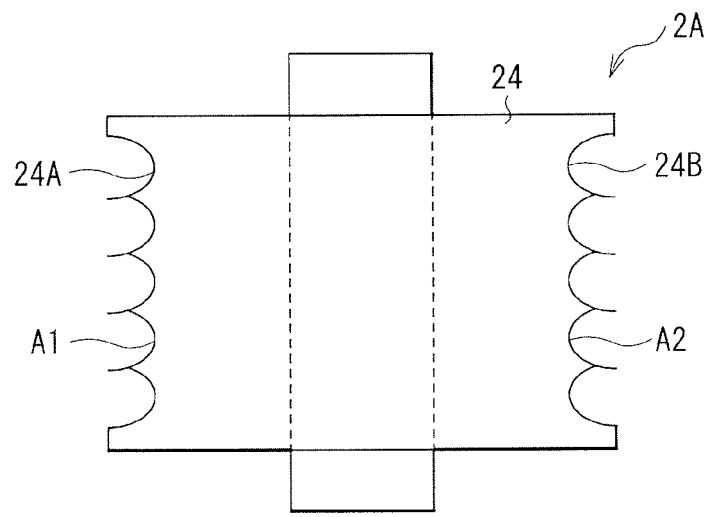
FIG. 7B is a plan diagram illustrating another exemplary configuration of the thin film transistor according to the Modification 2 of the present disclosure.
Figure 7C:
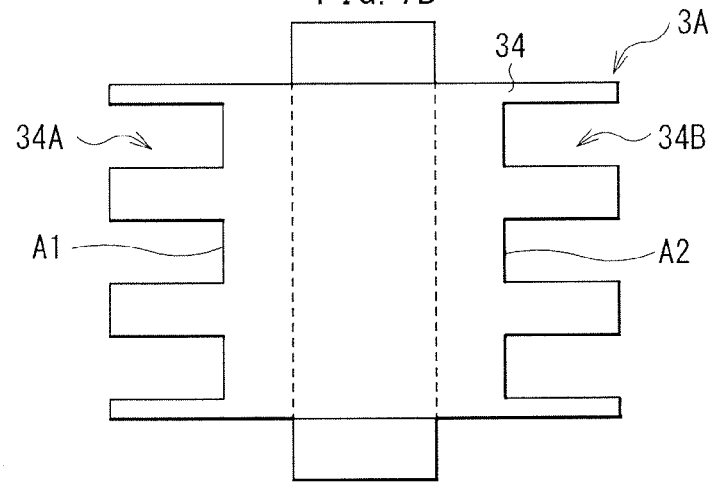
FIG. 7C is a plan diagram illustrating another exemplary configuration of the thin film transistor according to the Modification 2 of the present disclosure.

FIGS. 7A to 7C illustrate planar configurations of thin film transistors 1A, 2A, and 3A according to Modification 2 of an embodiment of the present disclosure. The thin film transistors 1A, 2A, and 3A are each a bottom-gate-type TFT as with the thin film transistor 1 of the first embodiment. The thin film transistors 1A and 2A are different from the first and second embodiments in that the comblike and rounding connection sections A1 and A2 in the first and second embodiments are provided on end faces of the semiconductor layer 14 and end faces of the semiconductor layer 24, respectively. The thin film transistor 3A is configured such that the connection sections A1 and A2 formed by the plurality of through-holes 34 (the through-holes $34A_1$, $34A_2$, and $34A_3$ and the through-holes $34B_1$, $34B_2$, and $34B_3$,) in the Modification 1 are provided on end faces of the semiconductor layer 34 as with the thin film transistors 1A and 2A.

In this way, the connection sections A1 and A2 between the semiconductor layer 14 (24 or 34) and the source electrode 16A as well as the drain electrode 16B are provided on the end faces of the semiconductor layer 14 (24 or 34), which also provides effects similar to those in the first and second embodiments and the Modification 1. This is because each of the surfaces, which are opposite to the opposed surfaces with the gate electrode 12 in between, of the connection sections A1 and A2 makes a minor contribution to reduction in contact resistance. In this way, the connection sections A1 and A2 are provided on the end faces of the semiconductor layer 14 (24 or 34), and the semiconductor layer 14 (24 or 34) located on a side opposite to each of the opposed surfaces of the connection sections A1 and A2 is partially removed, thereby a smaller thin film transistor is allowed to be formed.

Figure 8:
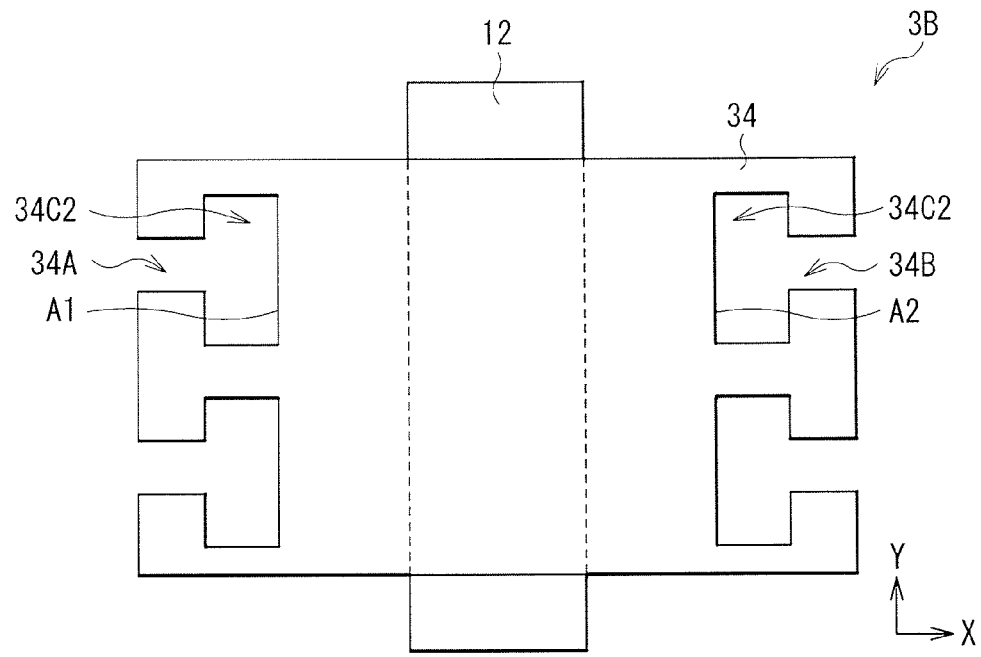
FIG. 8 is a plan diagram illustrating another exemplary configuration of the thin film transistor according to the Modification 2 of the present disclosure.
Figure 9:
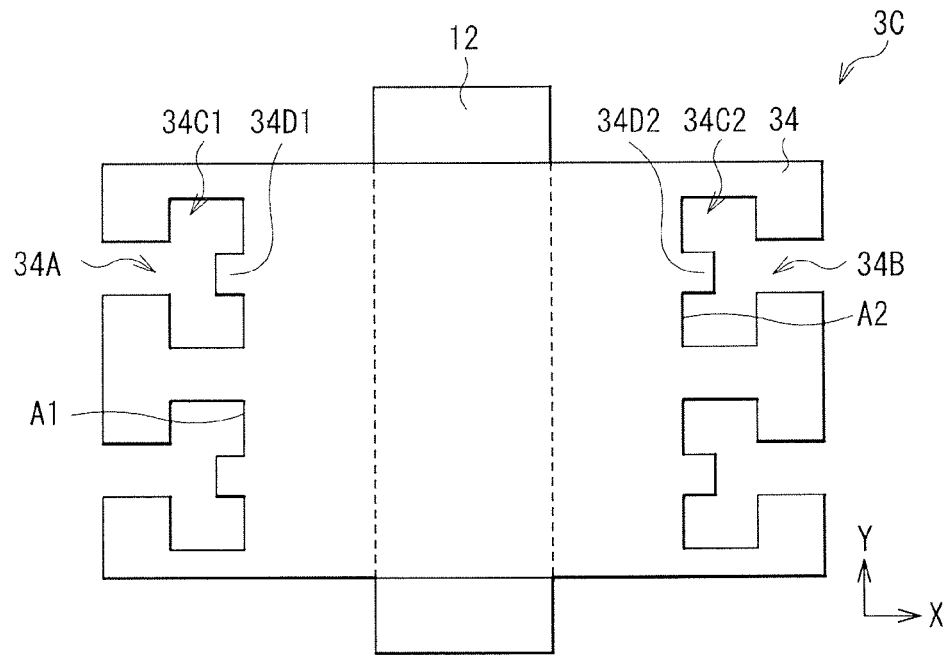
FIG. 9 is a plan diagram illustrating another exemplary configuration of the thin film transistor according to the Modification 2 of the present disclosure.

The connection sections A1 and A2 may each not limitedly have the comblike shape (the thin film transistors 1, 1A, and 3A), the rounding shape (the thin film transistor 2), and the lens array shape (the thin film transistor 2A), and may have any shape as long as the contact area between the semiconductor layer 14, etc. and each of the source electrode 16A and the drain electrode 16B increases. For example, as illustrated in FIG. 8, for example, winglike portions $34C_1$ and $34C_2$ extending in a Y axis direction may be provided on the opposed surfaces of the through holes 34A and 34B provided on the end faces of the semiconductor layer 34. In addition, as illustrated in FIG. 9, convex portions $34D_1$ and $34D_2$ may be provided within the winglike portions $34C_1$ and $34C_2$ of the through holes 34A and 34B, respectively.

Figure 10:
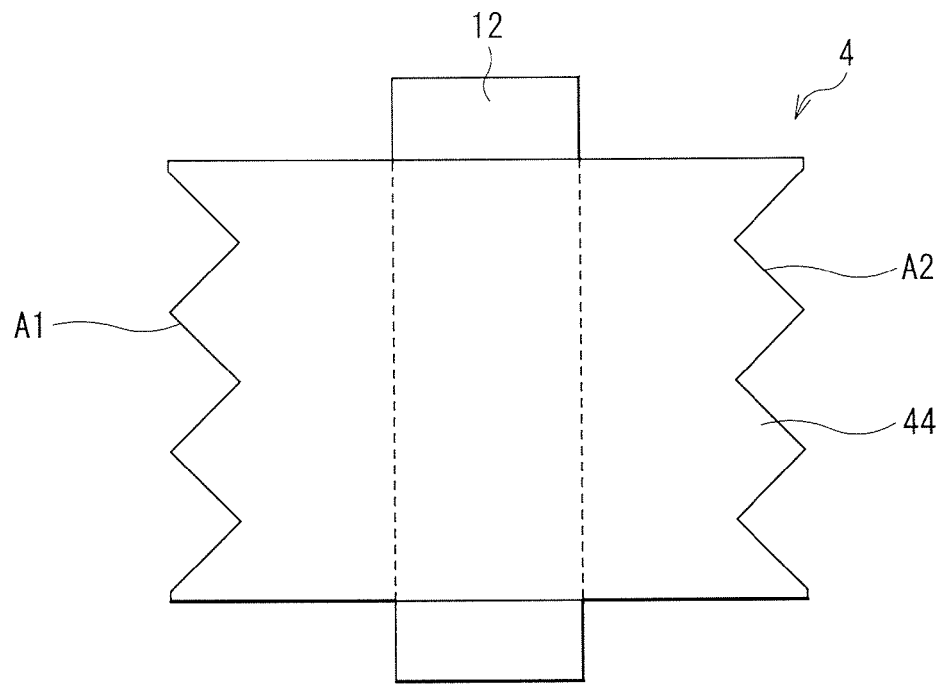
FIG. 10 is a plan diagram illustrating another exemplary configuration of the thin film transistor according to the Modification 2 of the present disclosure.
Figure 11:
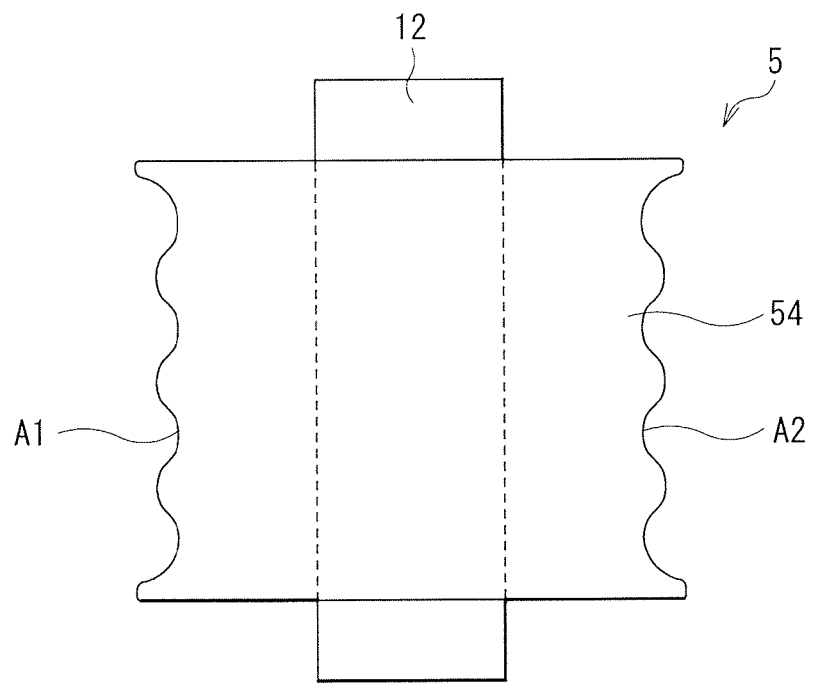
FIG. 11 is a plan diagram illustrating another exemplary configuration of the thin film transistor according to the Modification 2 of the present disclosure.

Alternatively, the connection sections A1 and A2 may each be formed into a sawtooth shape as in a thin film transistor 4 illustrated in FIG. 10, or may each be formed into a wave shape or a lens array shape as in a thin film transistor 5 illustrated in FIG. 11.

[3-3. Modification 3]

Figure 12A:
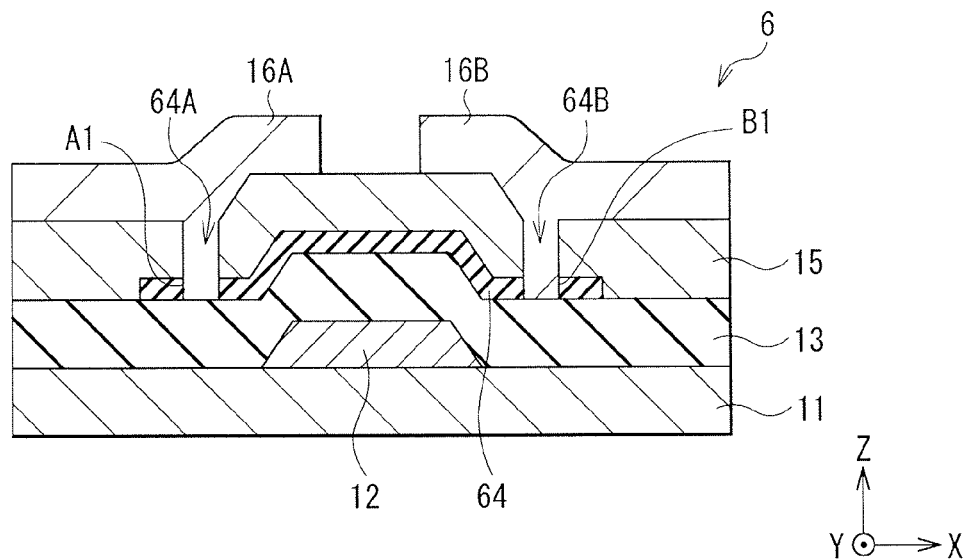
FIG. 12A is a cross-sectional diagram illustrating a configuration of a thin film transistor according to Modification 3 of the present disclosure.
Figure 12B:
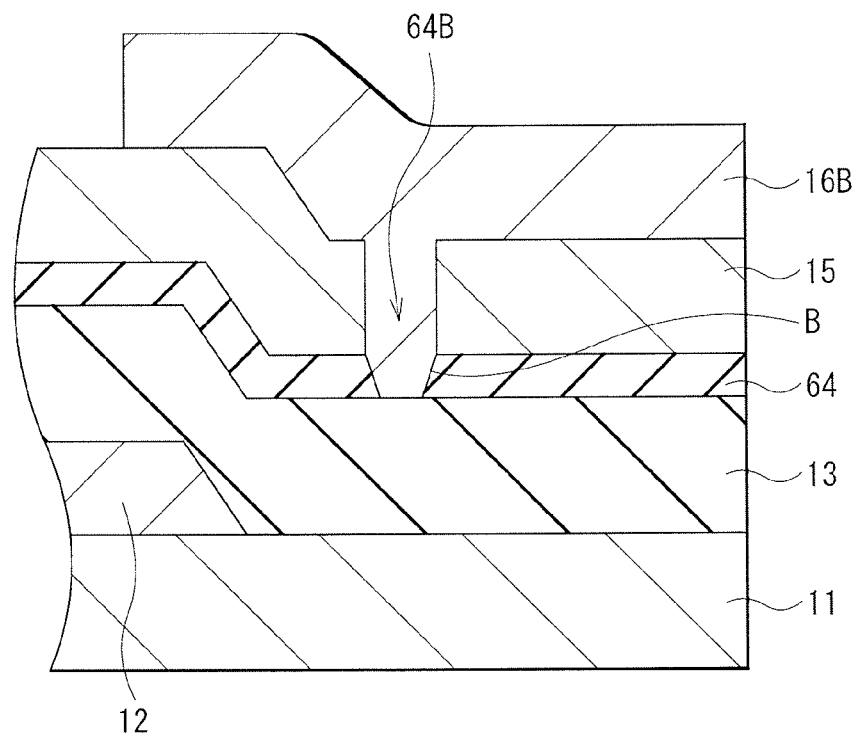
FIG. 12B is an expanded diagram of a connection section of the thin film transistor illustrated in FIG. 12A.

FIG. 12A illustrates a cross-sectional configuration of a thin film transistor 6 according to Modification 3 of an embodiment of the present disclosure. The thin film transistor 6 is a bottom-gate-type TFT as with the thin film transistor 1 of the first embodiment. The Modification 3 is different from the first and second embodiments and the Modifications 1 and 2 in that each of wall surfaces of through-holes 64A and 64B forming connection sections A1 and A2 between a semiconductor layer 64 and the source electrode 16A as well as the drain electrode 16B has a cone angle as illustrated in FIG. 12B.

The through-holes 64A and 64B should each have a wall surface having a cone angle in at least the semiconductor layer 64, as illustrated in FIG. 12A. With such through-holes 64A and 64B, for example, a wafer may be kept at low temperature during dry etching using $Cl_2$ as an etching gas, resulting in increase in adhesion of polymer on an etched sidewall. As a result, a tapered shape as illustrated in FIG. 12B is formed. Alternatively, an oxide film is etched while a resist is side-etched using $C_4F_8$ and $O_2$ as etching gases, thereby the tapered shape as illustrated in FIG. 12B is also formed.

In this way, in the thin film transistor 6 of the Modification 3, the wall surface of each of the through-holes 64A and 64B in the semiconductor layer 64 is made tapered. It is therefore possible to increase contact area between the semiconductor layer 64 and the source electrode 16A as well as the drain electrode 16B in the connection sections A1 and A2. Consequently, it is possible to further decrease contact resistance of each of the connection sections A1 and A2. It is also possible to improve EM resistance.

[3-4. Modification 4]

Figure 13:
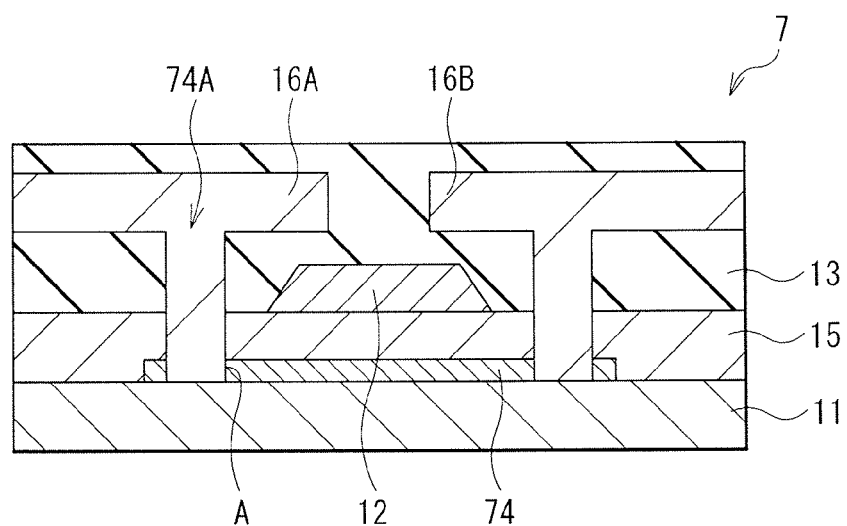
FIG. 13 is a cross-sectional diagram illustrating a configuration of a thin film transistor according to Modification 4 of the present disclosure.

FIG. 13 illustrates a cross-sectional configuration of a thin film transistor 7 according to Modification 4 of an embodiment of the present disclosure. The thin film transistor 7 is different from the first and second embodiments and the Modifications 1 to 3 in being a so-called top-gate-type TFT (having a staggered structure). In the thin film transistor 7, the semiconductor layer 14, the channel protective film 15, the gate electrode 12, the gate insulating film 13 and the source and drain electrodes 16A and 16B are provided in this order on the substrate 11 configured of glass or the like.

The thin film transistor 7 of the Modification 4 exhibits the same effects as those in the first embodiment, and advantageously allows source-to-drain capacitance to be decreased due to the top-gate-type structure thereof. Consequently, the thin film transistor 7 exhibits an effect of decreased variation in electric potential on a drain electrode 16B side against variation in electric potential at the gate electrode 16A.

<4. Application Examples>

Application examples of the display unit including one of the thin film transistors 1 to 7 as described above to electronic apparatuses are now described. Examples of the electronic apparatuses may include a television unit, a digital camera, a notebook personal computer, a mobile terminal device such as a mobile phone, and a video camcorder. In other words, the display unit is applicable to electronic apparatuses in various fields for displaying externally-received or internally-generated image signals as still or video images.

Application Example 1

Figure 14A:
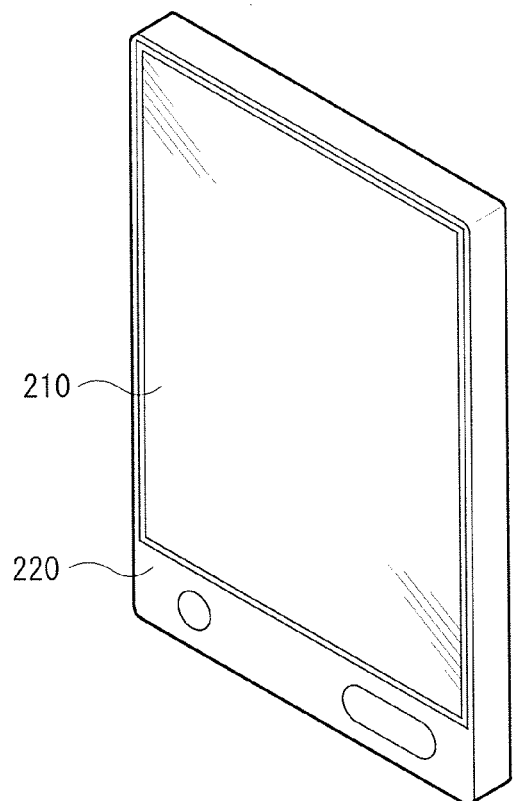
FIG. 14A is a perspective diagram illustrating appearance of application example 1 of a display unit including the thin film transistor according to one of the above-described embodiments and Modifications.
Figure 14B:
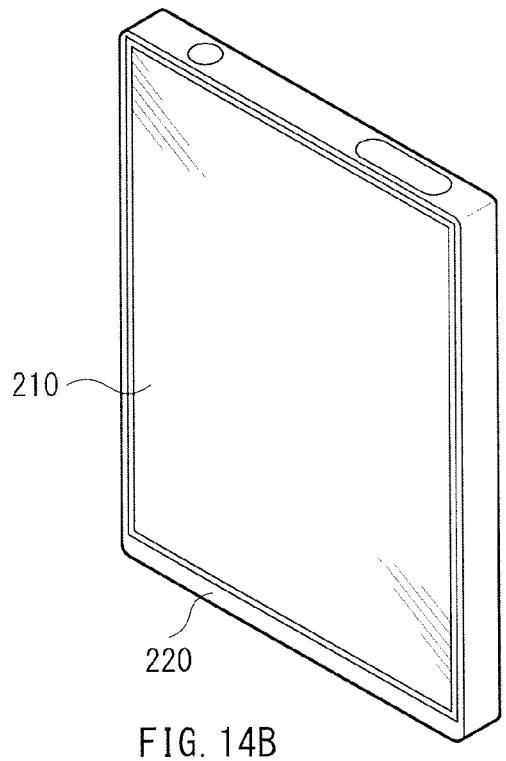
FIG. 14B is a perspective diagram illustrating another example of appearance of the application example 1 illustrated in FIG. 14A.

FIGS. 14A and 14B each illustrate appearance of an electronic book to which the display unit including one of the thin film transistors 1 to 7 according to the above-described embodiments and Modifications is applied. Such electronic books may each have, for example, a display section 210 and a non-display section 220. The display section 210 may be configured by the above-described display unit.

Application Example 2

Figure 15:
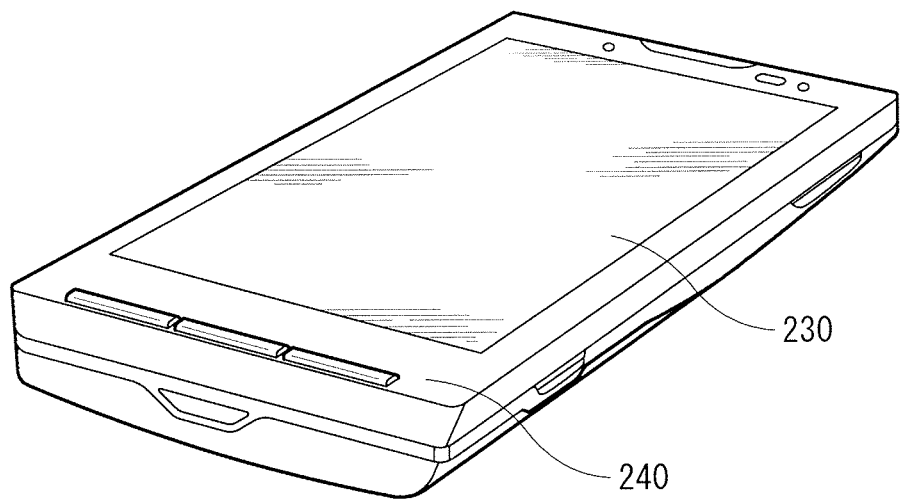
FIG. 15 is a perspective diagram illustrating appearance of application example 2.

FIG. 15 illustrates appearance of a smartphone to which the display unit including one of the thin film transistors 1 to 7 according to the above-described embodiments and Modifications is applied. The smartphone may have, for example, a display section 230 and a non-display section 240. The display section 230 may be configured by the above-described display unit.

Application Example 3

Figure 16:
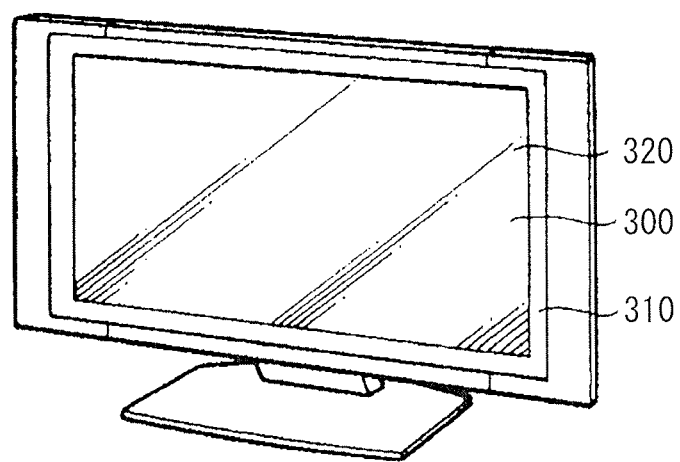
FIG. 16 is a perspective diagram illustrating appearance of application example 3.

FIG. 16 illustrates appearance of a television unit to which the display unit including one of the thin film transistors 1 to 7 according to the above-described embodiments and Modifications is applied. This television unit may have, for example, an image display screen section 300 including a front panel 310 and filter glass 320. The image display screen section 300 may be configured by the above-described display unit.

Application Example 4

Figure 17A:
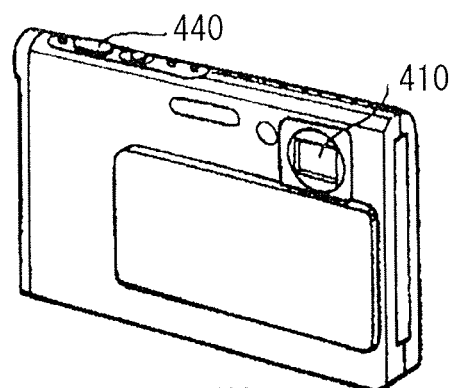
FIG. 17A is a perspective diagram illustrating appearance of application example 4 as viewed from a front side.
Figure 17B:
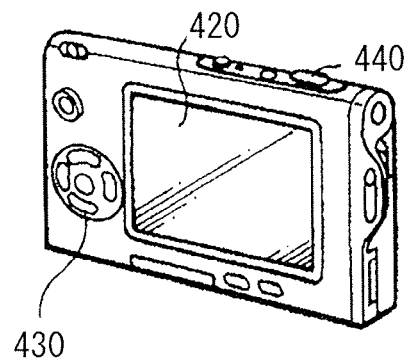
FIG. 17B is a perspective diagram illustrating appearance of application example 4 as viewed from a back side.

FIGS. 17A and 17B each illustrate appearance of a digital camera to which the display unit including one of the thin film transistors 1 to 7 according to the above-described embodiments and Modifications is applied. The digital camera may have, for example, a light emitting section 410 for flash, a display section 420, a menu switch 430, and a shutter button 440. The display section 420 may be configured by the above-described display unit.

Application Example 5

Figure 18:
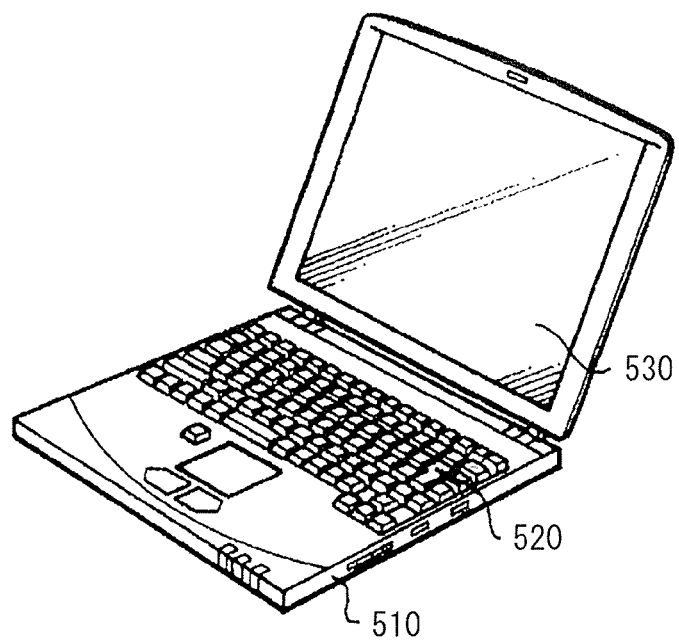
FIG. 18 is a perspective diagram illustrating appearance of application example 5.

FIG. 18 illustrates appearance of a notebook personal computer to which the display unit including one of the thin film transistors 1 to 7 according to the above-described embodiments and Modifications is applied. The notebook personal computer may have, for example, a main body 510, a keyboard 520 for input operation of characters and the like, and a display section 530 that displays images. The display section 530 may be configured by the above-described display unit.

Application Example 6

Figure 19:
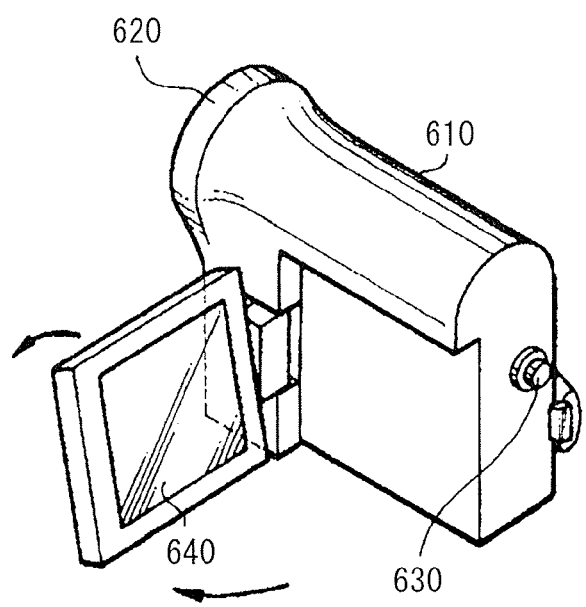
FIG. 19 is a perspective diagram illustrating appearance of application example 6.

FIG. 19 illustrates appearance of a video camcorder to which the display unit including one of the thin film transistors 1 to 7 according to the above-described embodiments and Modifications is applied. The video camcorder may have, for example, a main body section 610, an object-shooting lens 620 provided on a front side face of the main body section 610, a start/stop switch 630 for shooting, and a display section 640. The display section 640 may be configured by the above-described display unit.

Application Example 7

Figure 20A:
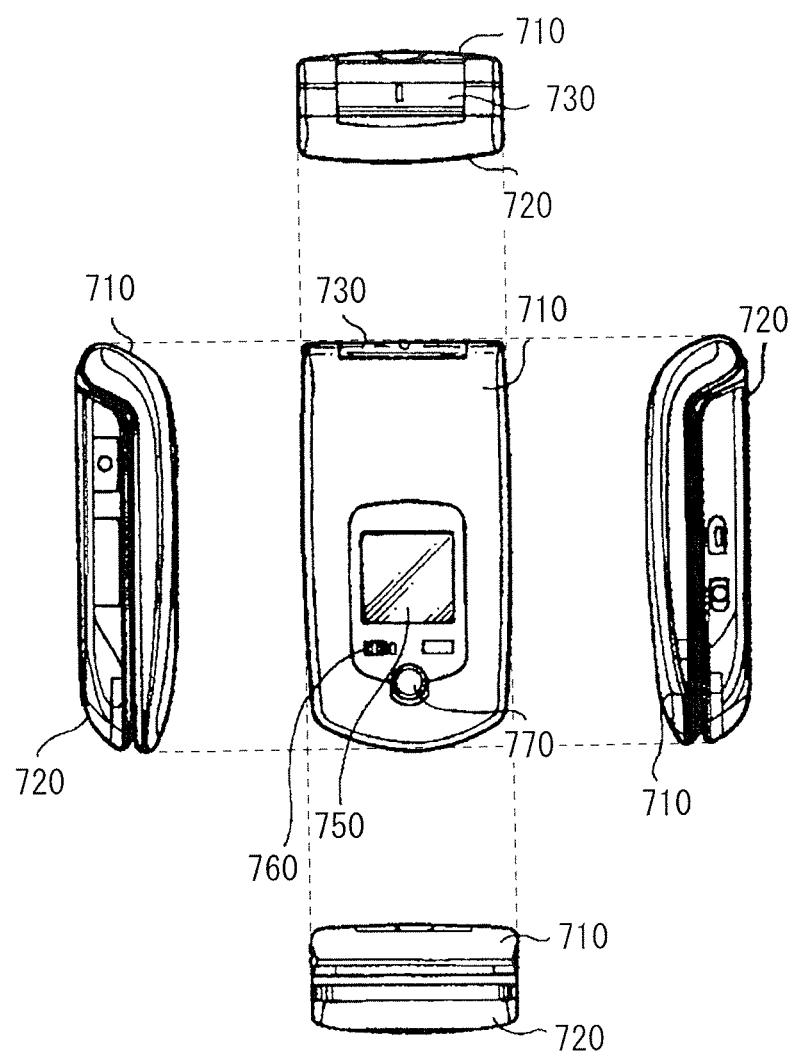
FIG. 20A includes diagrams illustrating application example 7 in a closed state.
Figure 20B:
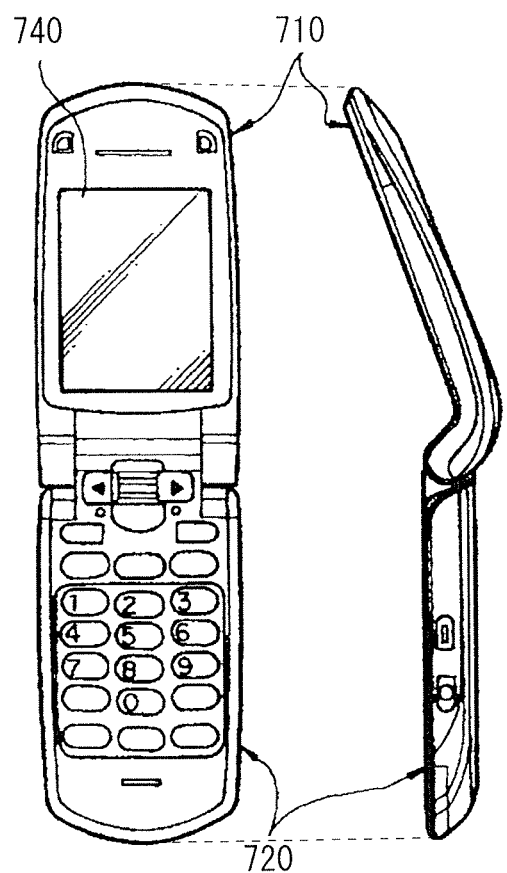
FIG. 20B is a diagram illustrating the application example 7 in an opened state.

FIGS. 20A and 20B each illustrate appearance of a mobile phone to which the display unit including one of the thin film transistors 1 to 7 according to the above-described embodiments and Modifications is applied. For example, the mobile phone may be configured of an upper housing 710 and a lower housing 720 connected to each other by a hinge section 730, and may have a display 740, a sub display 750, a picture light 760, and a camera 770. The display 740 or the sub display 750 may be configured by the above-described display unit.

Although the thin film transistors 1 to 7 of example embodiments of the present disclosure have been described with the first and second embodiments and the Modifications 1 to 4 hereinbefore, the disclosure is not limited thereto. The configuration of each of the thin film transistors 1 to 7, the method of manufacturing each thin film transistor, and the wiring pattern of the display unit according to example embodiments of the present disclosure may be freely modified or altered as long as effects similar to those in the above-described embodiments are obtained. For example, although the connection sections A1 and A2 provided in the semiconductor layer (for example, semiconductor layer 14) have the same shape in the above-described embodiments and Modifications, the connection sections A1 and A2 may have different shapes. For example, the connection section A1 may be formed into a comb shape, and the connection section A2 may be formed into a rounding shape.

Furthermore, although the above-described embodiments and Modifications have been described with a specific configuration of the thin film transistor 1, the thin film transistor 1 may further have another layer. The semiconductor layer 14 may be configured of silicon. Furthermore, although the above-described embodiments have been described on a case where the thin film transistor 1 configures the write transistor Tr2, the thin film transistor 1 may configure the drive transistor Tr1, for example.

In addition, while the material and the thickness of each layer or the film formation method and the film formation condition of each layer have been described in the above-described embodiments, these are not limitative. In other words, other materials and thicknesses or other film formation methods and film formation conditions may be used.

It is possible to achieve at least the following configurations from the above-described example embodiments of the disclosure.

(1) A thin film transistor, including:
a gate electrode and a pair of source and drain electrodes; and
a semiconductor layer having a channel formed therein, and having a pair of connection sections connected to the pair of source and drain electrodes, respectively,
wherein one or both of opposed surfaces of the pair of connection sections is a non-flat surface.
(2) The thin film transistor according to (1), wherein each of the connection sections forms a wall surface of a through-hole penetrating the semiconductor layer and an insulating layer provided between the semiconductor layer and the pair of source and drain electrodes.
(3) The thin film transistor according to (1) or (2), wherein a cross section of each of the connection sections has a concavo-convex shape.
(4) The thin film transistor according to (3), wherein the concavo-convex shape is one of a comb shape, a rounding shape, a sawtooth shape, a wave shape, and a lens array shape.
(5) The thin film transistor according to any one of (2) to (4), wherein the wall surface of the through-hole has a tapered shape in at least the semiconductor layer.
(6) The thin film transistor according to any one of (1) to (5), wherein the semiconductor layer is formed of one of low-temperature poly-silicon, an oxide semiconductor material, and an organic semiconductor material.
(7) The thin film transistor according to any one of (1) to (6), wherein the semiconductor layer is provided between the gate electrode and the source and drain electrodes.
(8) The thin film transistor according to any one of (1) to (6), wherein the pair of source and drain electrodes are provided between the gate electrode and the semiconductor layer.
(9) A method of manufacturing a thin film transistor, the method comprising:
forming a gate electrode on a substrate;
forming a semiconductor layer on the substrate and the gate electrode;
forming a through-hole in the semiconductor layer, and forming a pair of connection sections having opposed surfaces one or both of which is a non-flat surface; and
forming a pair of source and drain electrodes on the semiconductor layer, the source and drain electrodes being to be connected to the semiconductor layer via the connection sections.
(10) The method according to (9), wherein the connection sections are formed by dry etching.
(11) The method according to (9) or (10), wherein the semiconductor layer is provided between the gate electrode and the source and drain electrodes.
(12) The method according to (9) or (10), wherein the pair of source and drain electrodes are provided between the gate electrode and the semiconductor layer.
(13) An electronic apparatus provided with a display unit, the display unit being provided with a plurality of display devices and a plurality of thin film transistors configured to drive the display devices, each of the thin film transistors comprising:
a gate electrode and a pair of source and drain electrodes; and
a semiconductor layer having a channel formed therein, and having a pair of connection
sections connected to the pair of source and drain electrodes, respectively, wherein one or both of opposed surfaces of the pair of connection sections is a non-flat surface.

It should be understood that various changes and modifications to the presently preferred embodiments described herein will be apparent to those skilled in the art. Such changes and modifications can be made without departing from the spirit and scope of the present subject matter and without diminishing its intended advantages. It is therefore intended that such changes and modifications be covered by the appended claims.

The invention is claimed as follows:

1. A thin film transistor, comprising:
a gate electrode and a pair of source and drain electrodes; and
a semiconductor layer having a channel formed therein, and having a pair of connection sections connected to the pair of source and drain electrodes, respectively,
wherein one or both of opposed surfaces of the pair of connection sections is a non-flat surface,
wherein a cross section of each of the connection sections has a concavo-convex shape,
wherein each of the connection sections forms a wall surface of a through-hole penetrating the entire thickness of the semiconductor layer, the entire thickness of a first insulating layer and at least a portion of thickness of a second insulating layer,
wherein the first insulating layer is provided between the semiconductor layer and the pair of source and drain electrodes, and
wherein the second insulating layer is provided between the semiconductor layer and the gate electrode.

2. The thin film transistor according to claim 1, wherein the concavo-convex shape is one of a comb shape, a rounding shape, a sawtooth shape, a wave shape, and a lens array shape.

3. The thin film transistor according to claim 1, wherein the wall surface of the through-hole has a tapered shape in at least the semiconductor layer.

4. The thin film transistor according to claim 1, wherein the semiconductor layer is formed of one of low-temperature poly-silicon, an oxide semiconductor material, and an organic semiconductor material.

5. The thin film transistor according to claim 1, wherein the semiconductor layer is provided between the gate electrode and the source and drain electrodes.

6. The thin film transistor according to claim 1, wherein the pair of source and drain electrodes are provided between the gate electrode and the semiconductor layer.

7. A method of manufacturing a thin film transistor, the method comprising:
forming a gate electrode on a substrate;
forming a semiconductor layer on the substrate and the gate electrode;
forming a first insulating layer on the semiconductor layer;
forming a through-hole penetrating the entire thickness of the semiconductor layer, the entire thickness of the first insulating layer and at least a portion of thickness of a second insulating layer, wherein the second insulating layer is provided between the semiconductor layer and the gate electrode;

forming a pair of connection sections having opposed surfaces one or both of which is a non-flat surface, wherein a cross section of each of the connection sections has a concavo-convex shape,
wherein each of the connection sections forms a wall surface of the through-hole; and
forming a pair of source and drain electrodes on the semiconductor layer and the first insulating layer, the source and drain electrodes being to be connected to the semiconductor layer via the connection sections.

8. The method according to claim 7, wherein the connection sections are formed by dry etching.

9. The method according to claim 7, wherein the semiconductor layer is provided between the gate electrode and the source and drain electrodes.

10. The method according to claim 7, wherein the pair of source and drain electrodes are provided between the gate electrode and the semiconductor layer.

11. An electronic apparatus provided with a display unit, the display unit being provided with a plurality of display devices and a plurality of thin film transistors configured to drive the display devices, each of the thin film transistors comprising:

a gate electrode and a pair of source and drain electrodes; and
a semiconductor layer having a channel formed therein, and having a pair of connection sections connected to the pair of source and drain electrodes, respectively,
wherein one or both of opposed surfaces of the pair of connection sections is a non-flat surface,
wherein a cross section of each of the connection sections has a concavo-convex shape,
wherein each of the connection sections forms a wall surface of a through-hole penetrating the entire thickness of the semiconductor layer, the entire thickness of a first insulating layer and at least a portion of thickness of a second insulating layer,
wherein the insulating layer is provided between the semiconductor layer and the pair of source and drain electrodes, and
wherein the second insulating layer is provided between the semiconductor layer and the gate electrode.

* * * * *